(12) United States Patent
Aritome

(10) Patent No.: US 7,968,951 B2
(45) Date of Patent: Jun. 28, 2011

(54) INTERCONNECTING BIT LINES IN MEMORY DEVICES FOR MULTIPLEXING

(75) Inventor: Seiichi Aritome, Boise, ID (US)

(73) Assignee: Micron Technology, Inc., Boise, ID (US)

(*) Notice: Subject to any disclaimer, the term of this patent is extended or adjusted under 35 U.S.C. 154(b) by 71 days.

(21) Appl. No.: 12/560,103

(22) Filed: Sep. 15, 2009

(65) Prior Publication Data

US 2010/0008154 A1     Jan. 14, 2010

Related U.S. Application Data

(62) Division of application No. 11/512,985, filed on Aug. 30, 2006, now Pat. No. 7,598,165.

(51) Int. Cl.
*H01L 29/76* (2006.01)

(52) U.S. Cl. .... 257/396; 257/296; 257/368; 257/E27.06
(58) Field of Classification Search .................. 257/296, 257/368, 390
See application file for complete search history.

(56) References Cited

U.S. PATENT DOCUMENTS

| 4,278,989 | A | 7/1981 | Baba et al. |
| 5,333,282 | A | 7/1994 | Maejima et al. |
| 5,565,758 | A | 10/1996 | Yoeli et al. |
| 6,256,227 | B1 | 7/2001 | Atsumi et al. |
| 6,429,474 | B1 | 8/2002 | Gambino et al. |
| 6,665,204 | B2 | 12/2003 | Takeda |
| 7,312,118 | B2 * | 12/2007 | Kiyotoshi ............ 438/253 |

* cited by examiner

*Primary Examiner* — Dung A. Le
(74) *Attorney, Agent, or Firm* — Leffert Jay & Polglaze, P.A.

(57) ABSTRACT

An embodiment of a memory device has a plurality of conductive plugs formed on a semiconductor substrate and a pair of successively adjacent first and second bit lines overlying and in contact with each of the conductive plugs.

26 Claims, 10 Drawing Sheets

INTERCONNECTING BIT LINES IN MEMORY DEVICES FOR MULTIPLEXING

RELATED APPLICATION

This application is a divisional of U.S. application Ser. No. 11/512,985, titled "INTERCONNECTING BIT LINES IN MEMORY DEVICES FOR MULTIPLEXING," filed Aug. 30, 2006 now U.S. Pat. No. 7,598,165 which is commonly assigned and incorporated entirely herein by reference.

FIELD

The present invention relates generally to memory devices and in particular the present invention relates to interconnecting bit lines in memory devices for multiplexing.

BACKGROUND

Memory devices are typically provided as internal storage areas in computers. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed on an individual basis by charging the floating gate. The charge can be removed from the floating gate by a block erase operation. The data in a cell is determined by the presence or absence of the charge on the floating gate.

Because memory devices typically contain millions, if not billions, of memory cells, it is common to have one or more levels of multiplexing in coupling memory cells to an input/output (DQ) line of the memory device. For example, target memory cells, may be selectively coupled to a multiplexer through their associated bit lines. Outputs of the multiplexer are often provided to sensing devices, e.g., that sense the data values of the target memory cells and provide signals indicative of the data values on outputs. As feature sizes of memory devices continue to decrease, the difficulty of making the multiplexer connections may increase.

For the reasons stated above, and for other reasons stated below which will become apparent to those skilled in the art upon reading and understanding the present specification, there is a need in the art for alternative processes for interconnecting successively adjacent bit lines.

DETAILED DESCRIPTION

Figure 1:
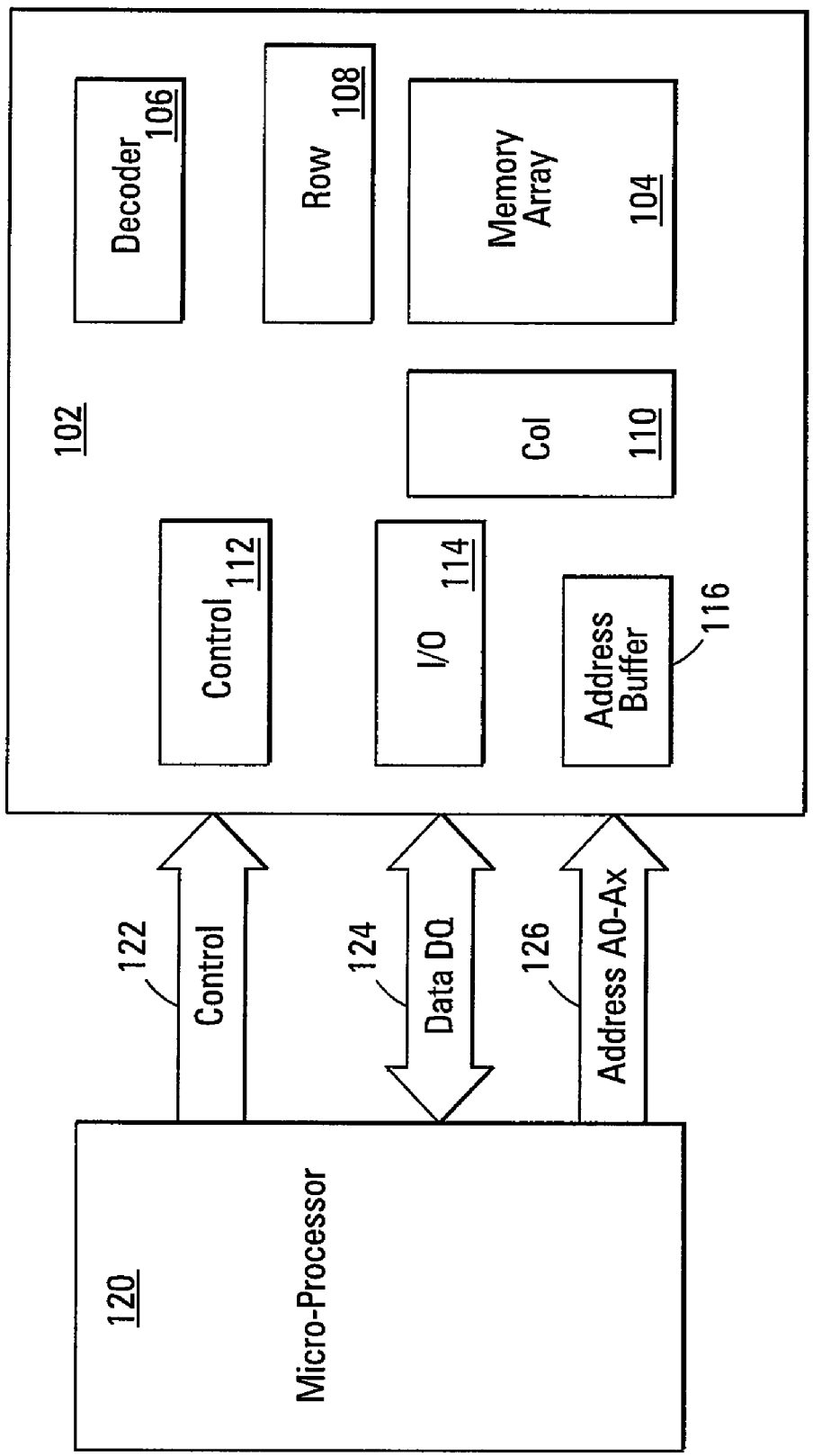
FIG. 1 is a block diagram illustration of a memory device, according to an embodiment of the invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The term wafer or substrate used in the following description includes any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

FIG. 1 is a block diagram illustration of a memory device 102, such as a NAND memory device, according to an embodiment of the invention. The memory device 102 may be fabricated as semiconductor device on a semiconductor substrate.

For one embodiment, memory device 102 includes an array of flash memory cells 104, an address decoder 106, row access circuitry 108, column access circuitry 110, control circuitry 112, Input/Output (I/O) circuitry 114, and an address buffer 116. Column access circuitry 110 includes multiplexing circuitry in accordance with embodiments of the invention.

Memory device 102 may be coupled an external microprocessor 120, or memory controller, for memory accessing as part of an electronic system. The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals. It will be appreciated by those skilled in the art that additional circuitry and control signals can be provided, and that the memory device of FIG. 1 has been simplified to help focus on the invention.

The memory array 104 includes memory cells arranged in row and column fashion. For one embodiment, each of the memory cells includes a floating-gate field-effect transistor capable of holding a charge. The cells may be grouped into blocks. Each of the cells within a block can be electrically programmed on an individual basis by charging the floating gate. The charge can be removed from the floating gate by a block erase operation.

Figure 2:
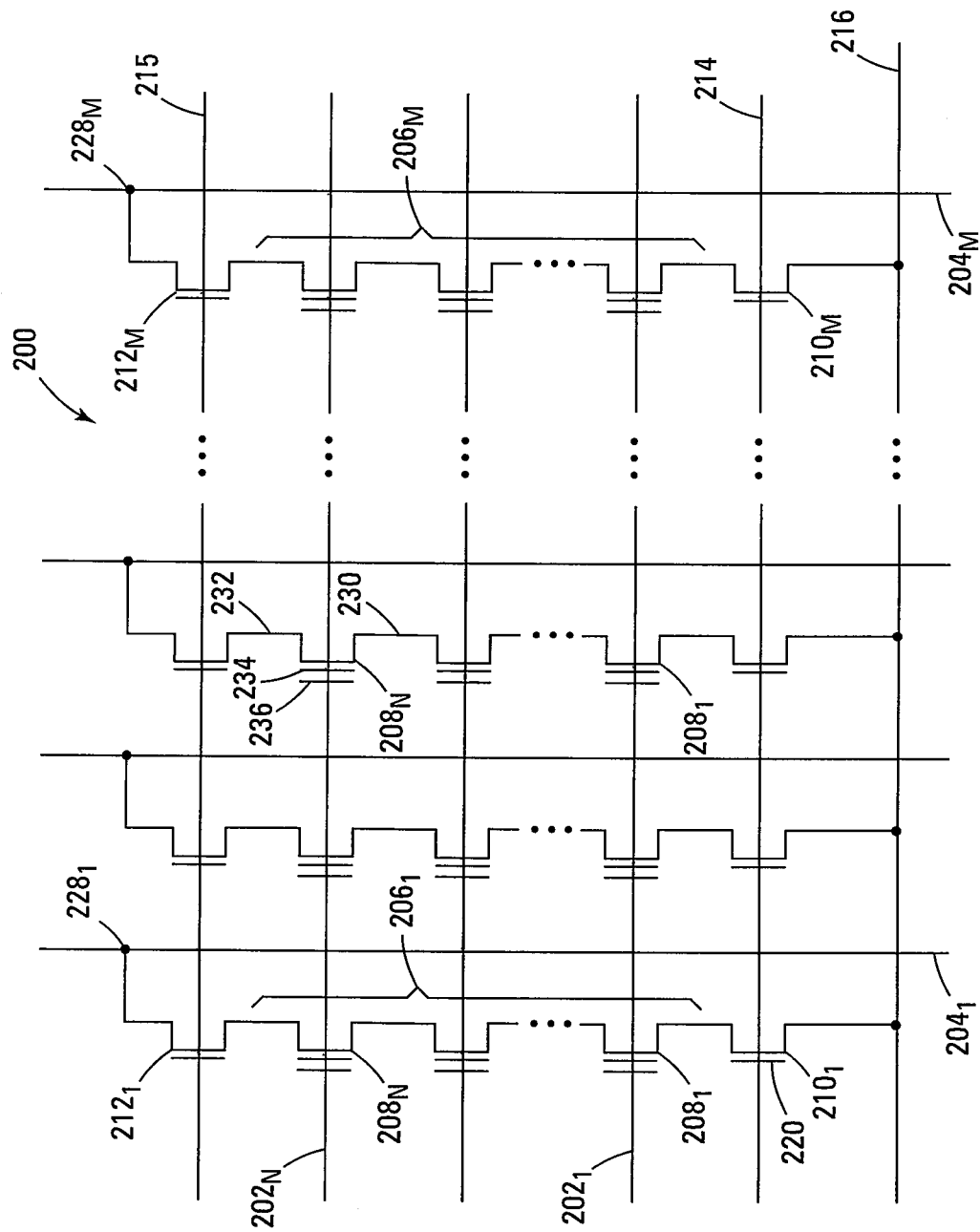
FIG. 2 is a schematic of a NAND memory array in accordance with another embodiment of the invention.

FIG. 2 is a schematic of a NAND memory array 200 as a portion of memory array 104 in accordance with another embodiment of the invention. As shown in FIG. 2, the memory array 200 includes word lines $202_1$ to $202_N$ and intersecting bit lines $204_1$ to $204_M$. For ease of addressing in the digital environment, the number of word lines 202 and the number of bit lines 204 are each some power of two, e.g., 256 word lines 202 by 4,096 bit lines 204.

Memory array 200 includes NAND strings $206_1$ to $206_M$. Each NAND string includes floating-gate transistors $208_1$ to $208_N$, each located at an intersection of a word line 202 and a bit line 204. The floating-gate transistors 208 represent non-volatile memory cells for storage of data. The floating-gate transistors 208 of each NAND string 206 are connected in series, source to drain, between a source select line 214 and a drain select line 215. Source select line 214 includes a source select gate 210, e.g., a field-effect transistor (FET), at each intersection between a NAND string 206 and source select line 214, and drain select line 215 includes a drain select gate 212, e.g., a field-effect transistor (FET), at each intersection between a NAND string 206 and drain select line 215. In this way, the floating-gate transistors 208 of each NAND string 206 are connected between a source select gate 210 and a drain select gate 212.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. Each source select gate 210 includes a control gate 220.

The drain of each drain select gate 212 is connected to the bit line 204 for the corresponding NAND string at a drain contact 228. For example, the drain of drain select gate $212_1$ is connected to the bit line $204_1$ for the corresponding NAND string $206_1$ at drain contact $228_1$. The source of each drain select gate 212 is connected to the drain of the last floating-gate transistor $208_N$ of the corresponding NAND string 206. For example, the source of drain select gate $212_1$ is connected to the drain of floating-gate transistor $208_N$ of the corresponding NAND string $206_1$.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of memory array 200 includes a NAND string 206 and the source and drain select gates connected thereto. A row of the floating-gate transistors 208 are those transistors commonly coupled to a given word line 202.

Figure 3:
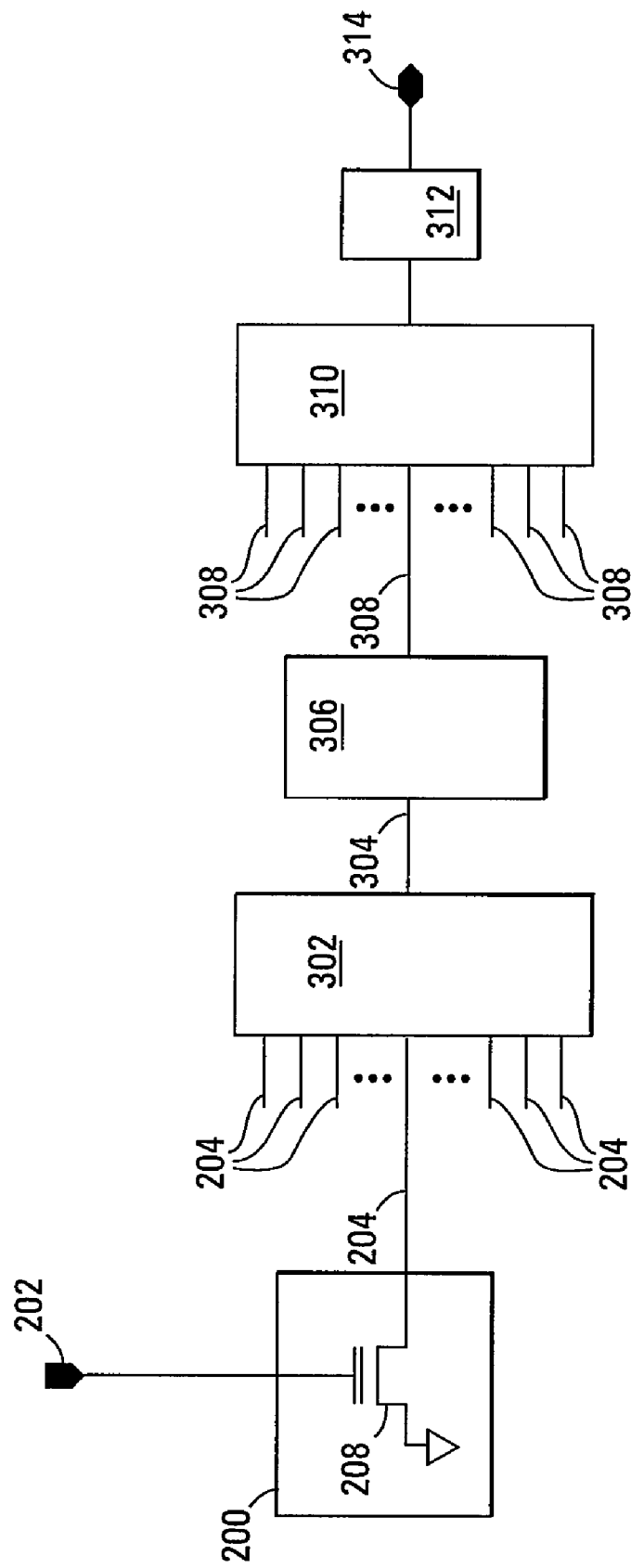
FIG. 3 is a schematic of a data path proceeding from a memory array through column access circuitry to I/O circuitry in accordance with an embodiment the invention.

FIG. 3 is a schematic of a data path proceeding from the memory array through the column access circuitry to the I/O circuitry in accordance with an embodiment the invention. Because memory devices typically contain millions, if not billions, of memory cells, it is common to have multiple levels of multiplexing in coupling a memory cell to a DQ line of the memory device.

As shown in FIG. 3, a target memory cell 208, as part of memory array 200, is selectively coupled to a first multiplexer 302 through its associated bit line 204, along with bit lines 204 from a number of other memory cells (not shown in FIG. 3). As one example, for a memory array 200 of the type depicted in FIG. 2, a target memory cell 208 might be selectively coupled to the first multiplexer 302 upon activation of its word line 202 and an associated drain select gate (not shown in FIG. 3). The first multiplexer 302 may be configured to select one of every two or more bit lines in response to an address decoder (not shown in FIG. 3) and couple it to an output 304. The first multiplexer 302 is configured or formed in accordance with embodiments of the invention.

The output 304 is provided to sensing and latching circuitry 306. The sensing and latching circuitry 306 senses the data value of the target memory cell 208 and provides a signal indicative of its data value on its output 308. The output 308 of sensing and latching circuitry 306 is then provided to column decode circuitry 310 along with other outputs 308 from other sensing devices (not shown in FIG. 3). The column decode circuitry 310 is configured to select one of a plurality of outputs 308 in response to an address decoder (not shown in FIG. 3) and couple it to an output latch 312 to place the data signal on the node 314, such as a DQ line, of the memory device. Note that the data path is generally bidirectional, and the output latch 312 generally also receives data values from the node 314 during a write operation to the memory device. Often, the data path includes two data signal legs, i.e., for carrying complementary logic levels.

Figure 4:
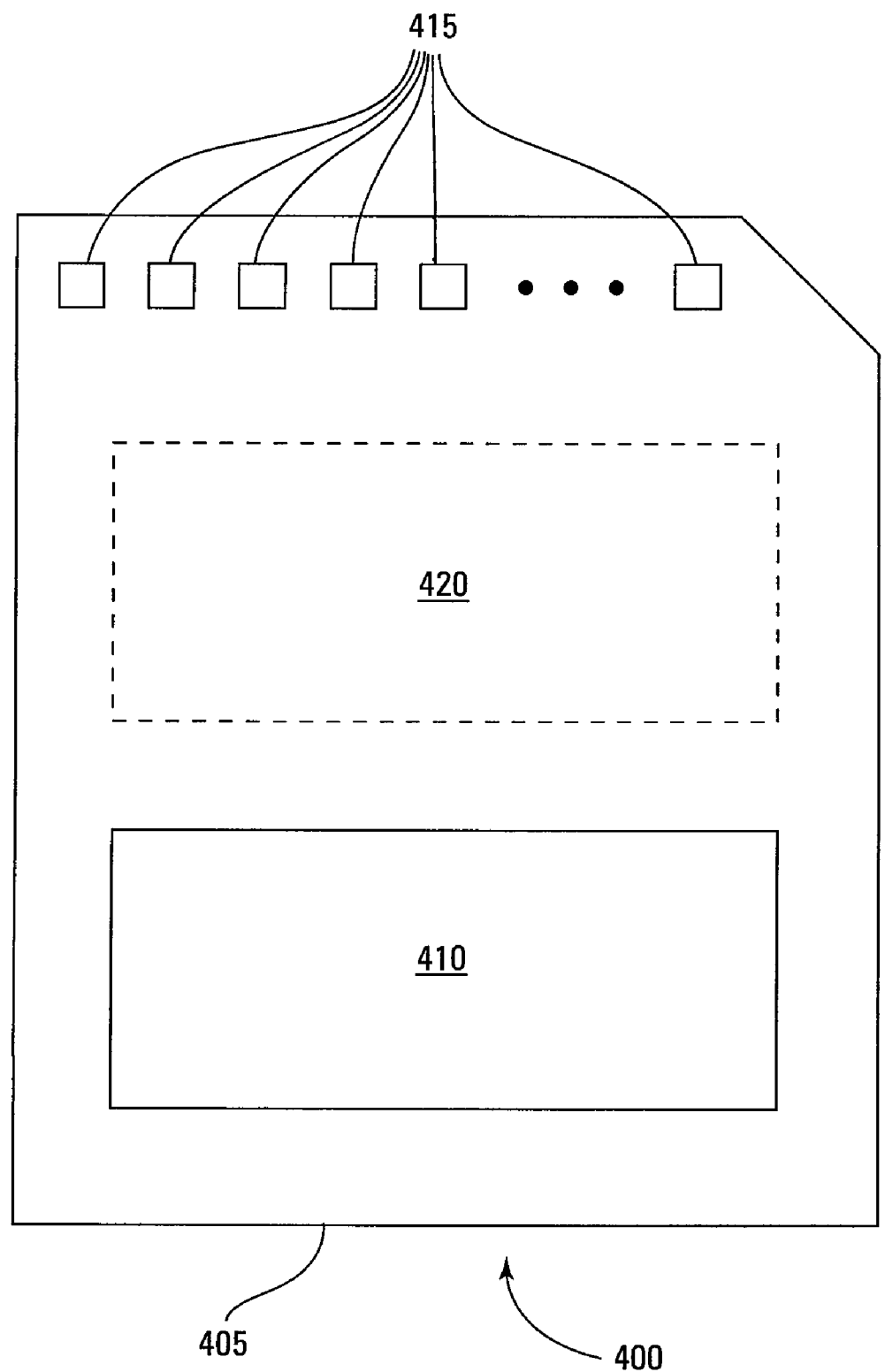
FIG. 4 is an illustration of an exemplary memory module, according to another embodiment of the invention.

FIG. 4 is an illustration of an exemplary memory module 400, according to another embodiment of the invention. Memory module 400 is illustrated as a memory card, although the concepts discussed with reference to memory module 400 are applicable to other types of removable or portable memory, e.g., USB flash drives, and are intended to be within the scope of "memory module" as used herein. In addition, although one example form factor is depicted in FIG. 4, these concepts are applicable to other form factors as well.

In some embodiments, memory module 400 will include a housing 405 (as depicted) to enclose one or more memory devices 410, though such a housing is not essential to all devices or device applications. At least one memory device 410 may be a NAND flash memory device and may be similar to memory device 102 of FIG. 1. The at least one memory device 410 includes a multiplexer, such as multiplexer 302 of FIG. 3, configured or formed in accordance with embodiments of the invention. Where present, the housing 405 includes one or more contacts 415 for communication with a host device. Examples of host devices include digital cameras, digital recording and playback devices, PDAs, personal computers, memory card readers, interface hubs and the like. For some embodiments, the contacts 415 are in the form of a standardized interface. For example, with a USB flash drive, the contacts 415 might be in the form of a USB Type-A male connector. For some embodiments, the contacts 415 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 415 provide an interface for passing control, address, and/or data signals between the memory module 400 and a host having compatible receptors for the contacts 415.

The memory module 400 may optionally include additional circuitry 420 which may be one or more integrated circuits and/or discrete components. For some embodiments, the additional circuitry 420 may include a memory controller for controlling access across multiple memory devices 410 and/or for providing a translation layer between an external host and a memory device 410. For example, there may not be a one-to-one correspondence between the number of contacts 415 and a number of I/O connections to the one or more memory devices 410. Thus, a memory controller could selectively couple an I/O connection (not shown in FIG. 4) of a memory device 410 to receive the appropriate signal at the appropriate I/O connection at the appropriate time or to provide the appropriate signal at the appropriate contact 415 at the appropriate time. Similarly, the communication protocol between a host and the memory module 300 may be different than what is required for access of a memory device 410. A memory controller could then translate the command sequences received from a host into the appropriate command sequences to achieve the desired access to the memory device 410. Such translation may further include changes in signal voltage levels in addition to command sequences.

The additional circuitry 420 may further include functionality unrelated to control of a memory device 410 such as logic functions as might be performed by an ASIC (application specific integrated circuit). Also, the additional circuitry 420 may include circuitry to restrict read or write access to the memory module 400, such as password protection, biometrics or the like. The additional circuitry 420 may include circuitry to indicate a status of the memory module 400. For example, the additional circuitry 420 may include functionality to determine whether power is being supplied to the memory module 400 and whether the memory module 400 is currently being accessed, and to display an indication of its status, such as a solid light while powered and a flashing light while being accessed. The additional circuitry 420 may further include passive devices, such as decoupling capacitors to help regulate power requirements within the memory module 400.

Figure 5:
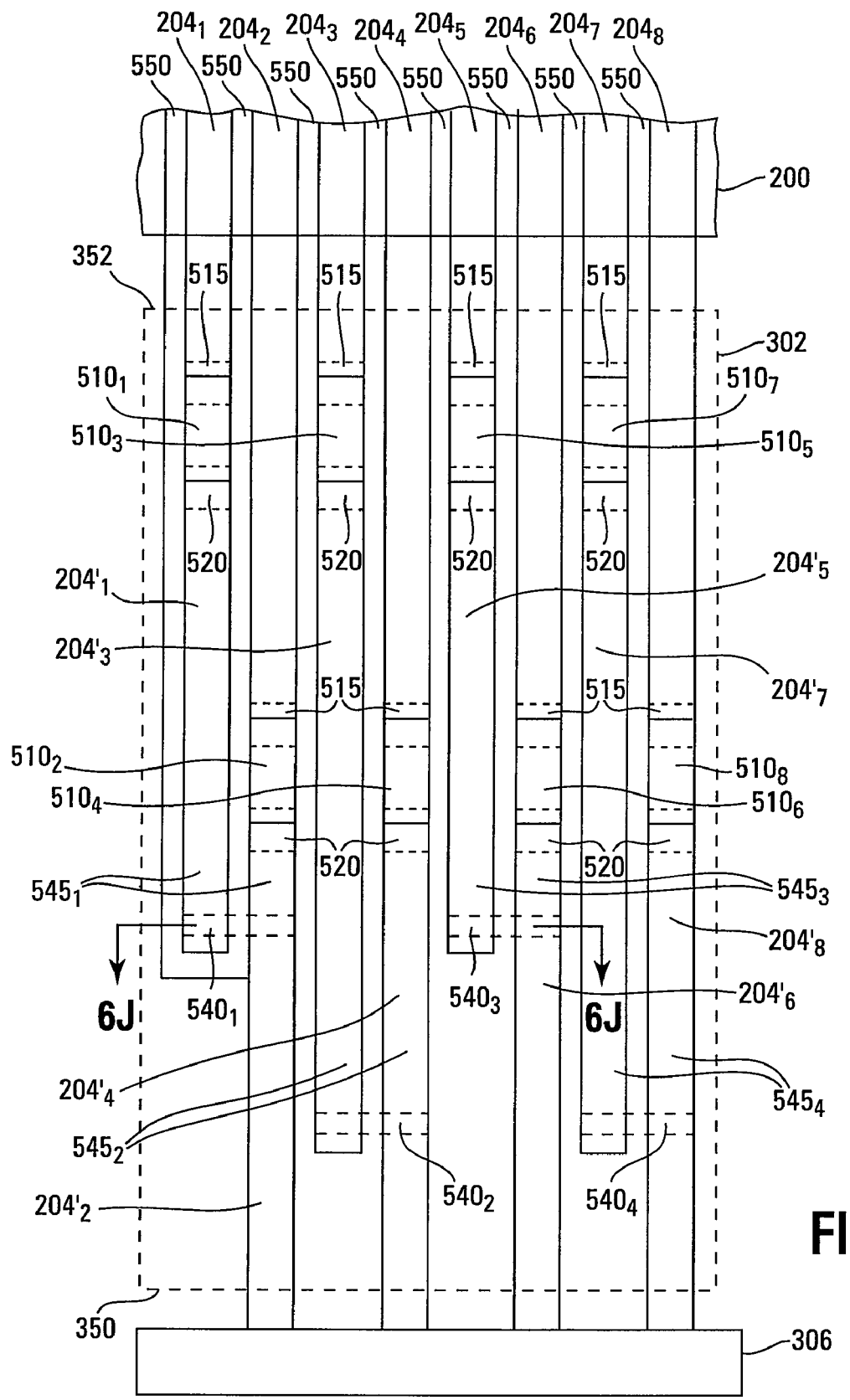
FIG. 5 is a plan view of a portion of multiplexer, according to another embodiment of the invention.

FIG. 5 is a plan view of a portion of multiplexer 302 coupled between a portion of memory array 200 and a portion of sensing and latching circuitry 306, according to another embodiment of the invention. FIG. 6J is a cross-section viewed along line 6J-6J of FIG. 5. FIGS. 6A-6J are cross-sectional views of the cross-section viewed along line 6J-6J of FIG. 5 at various stages of fabrication in accordance with another embodiment of the invention.

Bit lines 204 extend from memory array 200 into multiplexer 302, as shown in FIG. 5. Contacts 515 respectively couple bit lines 204 to first source/drain regions (not shown) of multiplexer gates 510, e.g., field-effect transistors (FETs), and contacts 520 respectively couple bit lines 204' to second source/drain regions (not shown) of multiplexer gates 510. Conductive plugs 540 electrically interconnect successively adjacent bit lines 204' to respectively form interconnected bit line pairs 545, as shown in FIGS. 5 and 6J.

One of the successively adjacent bit lines 204' of each interconnected bit line pair 545, in other words every other bit line 204', terminates within multiplexer 302 and does not extend to a distal end 350 of multiplexer 302 relative to array 200. For example, bit lines $204'_1$, $204'_3$, $204'_5$, and $204'_7$ respectively of interconnected bit line pairs $545_1$, $545_2$, $545_3$, and $545_4$ terminate within multiplexer 302 and do not extend to distal end 350, as shown in FIG. 5. The other bit line 204' of each interconnected bit line pair 545 extends beyond distal end 350 and couples to sensing and latching circuitry 306. For example, bit lines $204'_2$, $204'_4$, $204'_6$, and $204'_8$ respectively of interconnected bit line pairs $545_1$, $545_2$, $545_3$, and $545_4$ extend beyond the distal end of multiplexer 302 and couple to sensing and latching circuitry 306, as shown in FIG. 5.

Spacers 550 form loops within multiplexer 302 and respectively loop around ends of the bit lines 204' that terminate within multiplexer 302, as shown in FIG. 5. That is, spacers 550 respectively loop around the terminal ends, within multiplexer 302, of the bit lines 204' that terminate within multiplexer 302. For example, spacers 550 respectively loop around the terminal ends, within multiplexer 302, of bit lines $204'_1$, $204'_3$, $204'_5$, and $204'_7$, as shown in FIG. 5. Therefore, a spacer 550 loops around the end of every other bit line 204'. As shown in FIG. 6J, conductive plugs 540 underlie bit lines 204' and spacers 550.

Note that a longitudinal portion of each spacer 550 lies between, and for some embodiments above, the bit lines 204' of each bit line pair 545, as shown in FIG. 6J. Forming conductive plugs 540 underlying spacers 550 facilitates interconnecting the bit lines 204' of each bit line pair 545, which is otherwise made difficult by spacers 550.

The bit line 204' of each interconnected bit line pair 545 that extends beyond distal end 350 of multiplexer 302 couples the second source/drain regions of a pair of multiplexer gates 510 to sensing and latching circuitry 306. For example, bit line $204'_2$ of interconnected bit line pair $545_1$ couples the second source/drain regions of multiplexer gates $510_1$ and $510_2$ to sensing and latching circuitry 306, bit line $204'_4$ of interconnected bit line pair $545_2$ couples the second source/drain regions of multiplexer gates $510_3$ and $510_4$ to sensing and latching circuitry 306, etc, as shown in FIG. 5. In other words, every other bit line 204', i.e., bit lines 204' that extend to sensing and latching circuitry 306, respectively couples corresponding pairs of multiplexer gates 510 to sensing and latching circuitry 306.

The multiplexer gates 510 of each pair of multiplexer gates 510 coupled to a bit line 204' that extends to sensing and latching circuitry 306 respectively selectively couple the bit lines 204 respectively coupled to their first source/drain regions to that bit line 204'. For example, multiplexer gates $510_1$ and $510_2$ coupled to bit line $204'_2$ respectively selectively couple bit lines $204_1$ and $204_2$, respectively coupled to their first source/drain regions, to bit line $204'_2$, multiplexer gates $510_3$ and $510_4$ coupled to bit line $204'_4$ respectively selectively couple bit lines $204_3$ and $204_4$, respectively coupled to their first source/drain regions, to bit line $204'_4$, etc.

For one embodiment, conductive plugs 540 are staggered so that every other conductive plug 540 lies in the same plane and at about the same distance from distal end 350 of multiplexer 302 (or the proximal end 352 of multiplexer 302 relative to array 200), as shown in FIG. 5. For example, conductive plugs $540_1$ and $540_3$ lie in the plane of FIG. 6J and are at about the same distance from distal end 350, whereas conductive plug $540_2$, which lies between conductive plugs $540_1$ and $540_3$, does not lie in the plane of FIG. 6 and is at different distance from distal end 350 than conductive plugs $540_1$ and $540_3$, as shown in FIG. 5.

For another embodiment, the terminal ends, within multiplexer 302, of the bit lines 204' that terminate within multiplexer 302 are staggered in that every other one these bit lines 204' terminates within multiplexer 302 at a first distance from distal end 350, whereas the remaining bit lines 204' terminate within multiplexer 302 at second distance, different than the first distance, from distal end 350. For example, bit lines $204'_1$ and $204'_5$ terminate at the first distance from distal end 350, and bit lines $204'_3$ and $204'_7$ terminate at the second distance from distal end 350, as shown in FIG. 5. Note that for one embodiment, the staggering of conductive plugs 540 is associated with the staggering of the terminal ends of the bit lines 204' that terminate within multiplexer 302 in that a conductive plug 540 is adjacent each of these terminal ends.

Figure 6A:
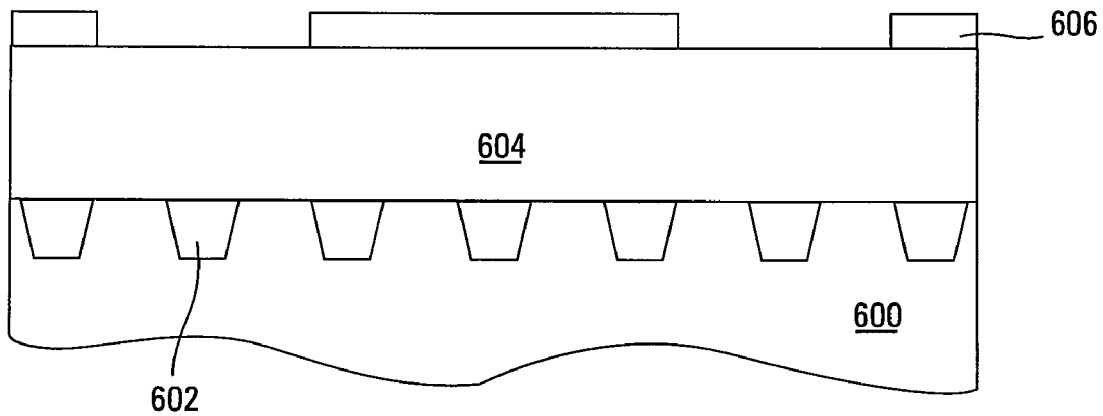
FIGS. 6A-6J are cross-sectional views of the cross-section viewed along line 6J-6J of FIG. 5 at various stages of fabrication in accordance with another embodiment of the invention.
Figure 6B:
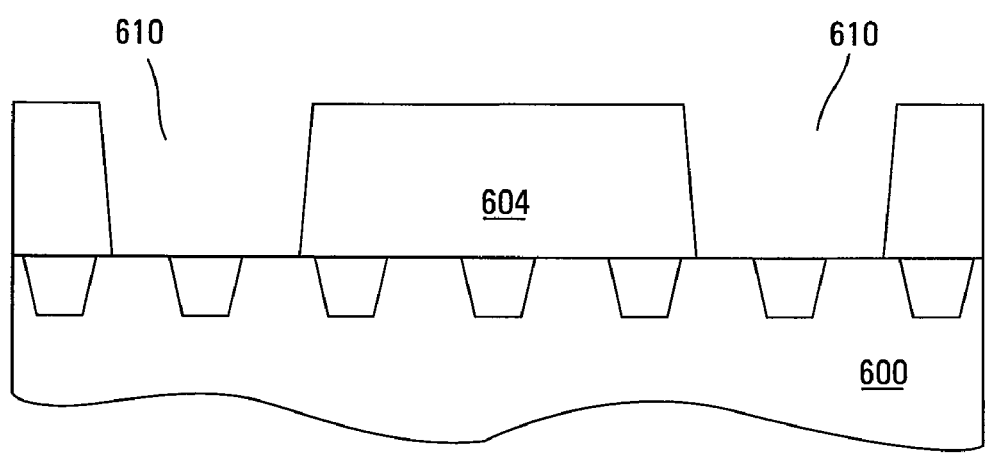

FIG. 6A depicts the cross-section of multiplexer 302 viewed along line 6J-6J of FIG. 5 after several processing steps have occurred. Formation of the structure depicted in FIG. 6A is well known and will not be detailed herein. In general, for one embodiment, the structure of FIG. 6A is formed by forming a plurality of isolation regions 602, such as shallow-trench isolation regions, in a semiconductor substrate 600 that is of monocrystalline silicon or the like. Isolation regions 602 are made from a suitable dielectric material, such as an oxide, e.g., a thermal oxide and/or a high-density-plasma (HDP) oxide, a spin-on dielectric material, e.g., hydrogen silsesquioxane (HSQ), hexamethyldisiloxane, octamethyltrisiloxane, etc. A bulk insulation (or bulk dielectric) layer 604 is formed overlying semiconductor substrate 600 and isolation regions 602. One example for the insulation layer 604 would be a doped silicate glass. Examples of doped silicate glasses include BSG (borosilicate glass), PSG (phosphosilicate glass), and BPSG (borophosphosilicate glass). p A mask layer 606, such as a photoresist layer, is formed on insulation layer 604 and is patterned for respectively exposing portions of insulation layer 604 for removal. The exposed portions of insulation layer 604 are removed in FIG. 6B stopping at an upper surface of semiconductor substrate 600 and/or upper surfaces of isolation regions 602, thereby exposing these surfaces. For one embodiment, an anisotropic dry etch, e.g., a reactive ion etch, accomplishes the removal of the exposed portions of insulation layer 604. The removal process forms holes 610 through insulation layer 604. Mask layer 606 may be removed after holes 610 are formed.

Figure 6C:
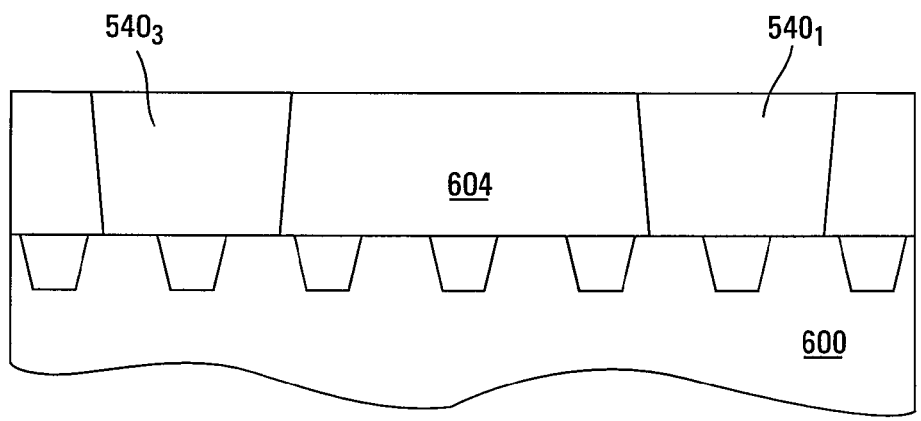

Conductive plugs 540 are formed in holes 610 in FIG. 6C. For one embodiment, conductive plugs 540 include a first conductive layer, such as a polysilicon layer, formed on the upper surface of semiconductor substrate 600 and/or the upper surfaces of isolation regions 602. For another embodiment, a second conductive layer may be formed on the polysilicon layer using standard metallization procedures. For example, for one embodiment, the second conductive layer may be formed by depositing a barrier layer, e.g., a refractory metal nitride, such as titanium nitride (TiN) or tungsten nitride ($WN_x$), on the polysilicon layer, e.g., using CVD. An adhesion layer, e.g., a metal layer, such as titanium (Ti) is deposited on barrier layer, e.g., using CVD. A metal layer, such as tungsten (W), is deposited on the adhesion layer, e.g., using CVD. In addition to CVD, physical vapor deposition (PVD), e.g., sputtering, can be used. For another embodiment, the second conductive layer may be a refractory metal silicide layer formed on the polysilicon layer. The metals of chromium (Cr), cobalt (Co), hafnium (Hf), molybdenum (Mo), niobium (Nb), tantalum (Ta), titanium (Ti), tungsten (W), vanadium(V) and zirconium (Zr) are generally recognized as refractory metals. For another embodiment, the thus formed conductive plugs 540 may be subjected to chemical mechanical planerization (CMP) so that their upper surfaces are substantially flush with an upper surface of insulation layer 604, as shown in FIG. 6C.

Figure 6D:
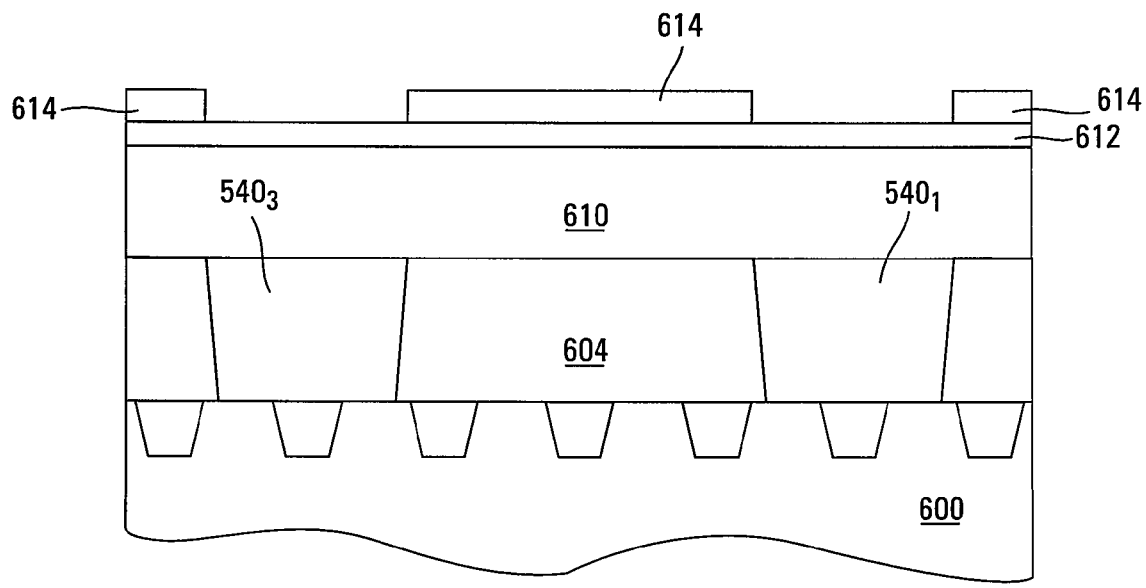
Figure 6E:
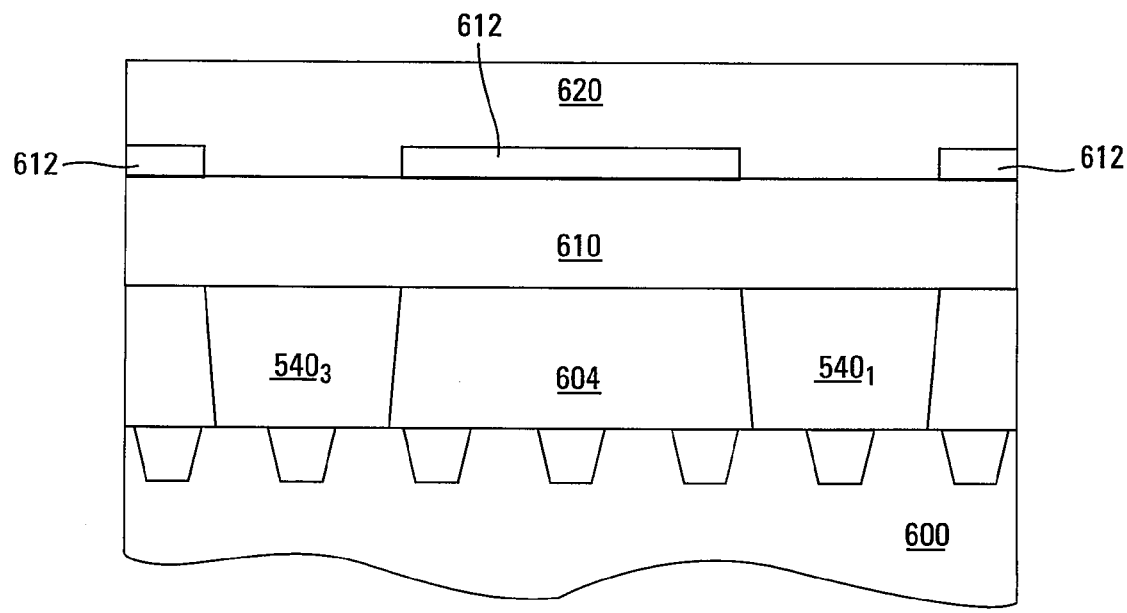

A bulk insulation (or bulk dielectric) layer 610, e.g., of doped silicate glass, is formed on insulation layer 604 and conductive plugs 540 in FIG. 6D. An etch-stop layer 612, e.g., of silicon nitride, is formed on insulation layer 606 in FIG. 6D. A mask layer 614, such as a photoresist layer, is formed on etch-stop layer 612 and is patterned for respectively exposing portions of etch-stop layer 612 for removal. The exposed portions of etch-stop layer 612 are removed in FIG. 6E, e.g., using an etch selective to etch-stop layer 612, stopping at an upper surface of insulation layer 610. Mask layer 614 is then removed, and a bulk insulation (or bulk dielectric) layer 620, e.g., of doped silicate glass, is formed overlying insulation layer 610 and etch-stop layer 612 in FIG. 6E.

Figure 6F:
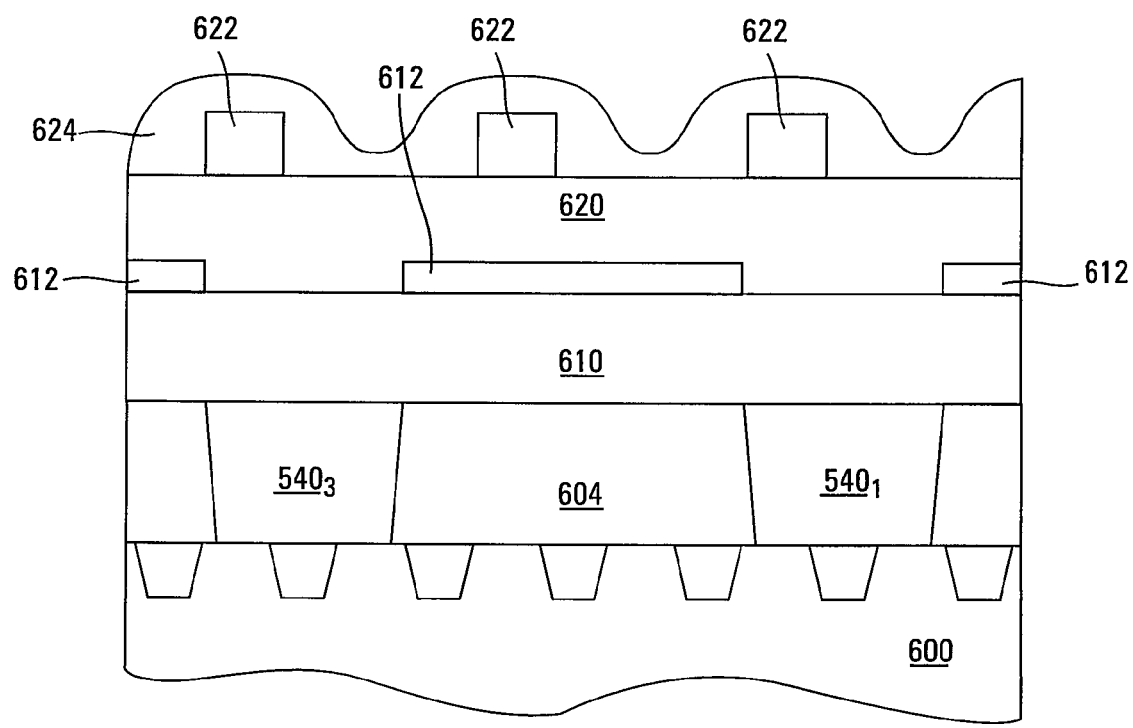
Figure 6G:
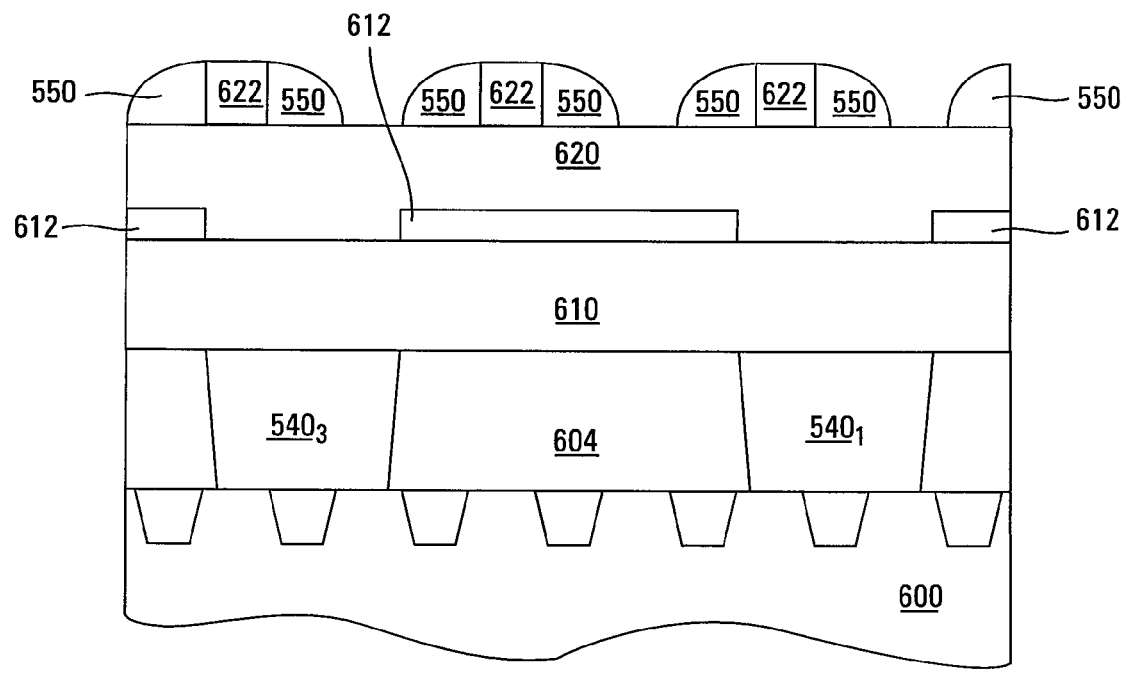

A mask layer, such as a photoresist layer, is formed on insulation layer 620 and is patterned in FIG. 6F to form mask segments (or lines) 622. A dielectric layer 624, e.g., of silicon nitride, is formed overlying mask segments 622 and insulation layer 620 in FIG. 6F, e.g., using a blanket deposition. Portions of dielectric layer 624 are then anisotropically removed so that remaining portions of dielectric layer 624 self align with and form the spacers 550 on sidewalls of mask segments 622 in FIG. 6G. For one embodiment, this is accomplished using an anisotropic etching process that selectively removes horizontal portions of dielectric layer 624.

Figure 6H:
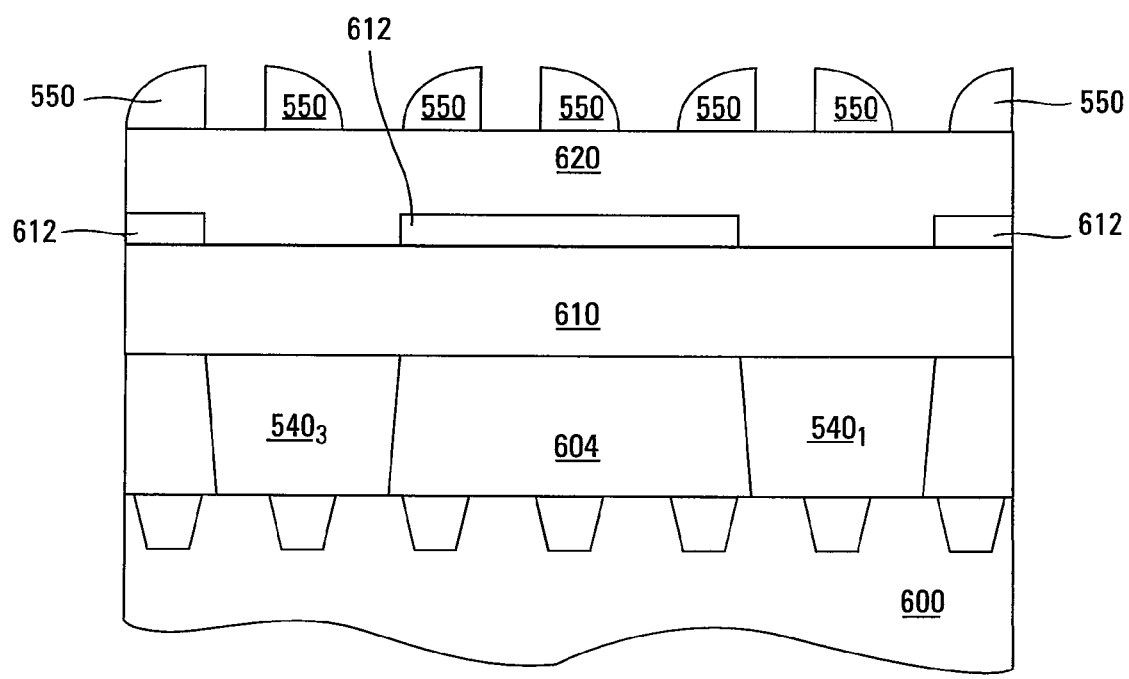
Figure 6I:
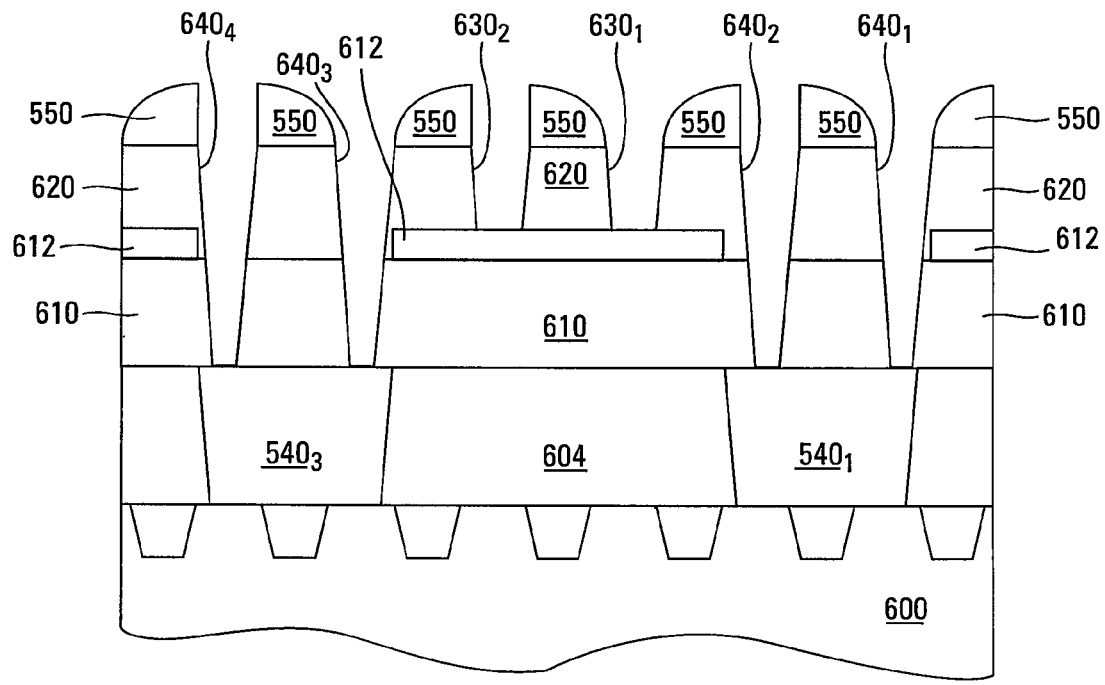
Figure 6J:
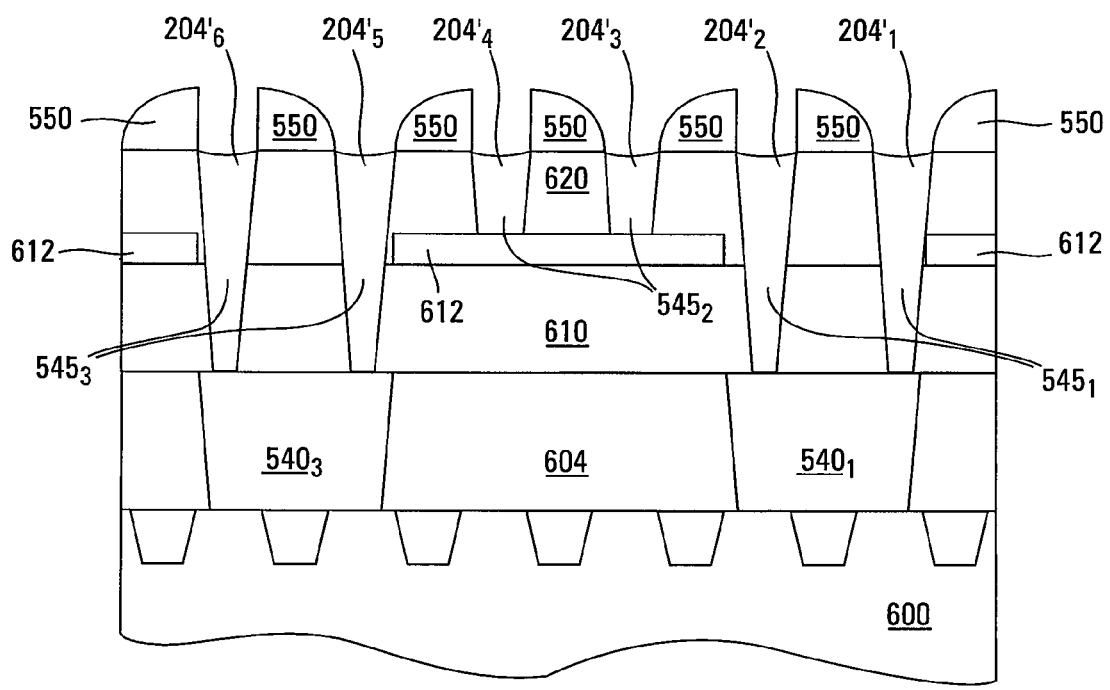

Mask segments 622 are removed in FIG. 6H, e.g., using an etch selective to mask segments 622, stopping at an upper surface of insulation layer 620 and leaving spacers 550. Spacers 550 form a pattern for respectively exposing portions of insulation layer 620 for removal. The exposed portions of insulation layer 620 are removed in FIG. 6I. For portions of insulation layer 620 formed on etch-stop layer 612, the removal stops at etch-stop layer 612. This forms trenches 630 that expose portions of etch-stop layer 612, as shown in FIG. 6I. For portions of insulation layer 620 formed on insulation layer 610, the removal exposed portions of insulation layer 620 exposes portions of insulation layer 610 for removal and thereby removes those portions of insulation layer 610 and stops on plugs 540. This forms trenches 640 that expose portions of conductive plugs 540, as shown in FIG. 6I. For one embodiment, an anisotropic dry etch, e.g., a reactive ion etch, accomplishes the removal of the exposed portions of insulation layer 620 and the subsequently exposed portions of insulation layer 610. Note that the etch is selective of insulation layers 610 and 620.

Bit lines 204' are then formed by depositing one or more conductive materials in trenches 630 and 640 in FIG. 6J. For one embodiment, bit lines 204' are formed as described above in conjunction with conductive plugs 540 so that bit lines 204' are of the same materials as conductive plugs 540. That is, a first conductive layer, e.g., of polysilicon, is formed on conductive plugs 540 and etch-stop layer 612 and a second conductive layer, e.g., of the same materials as described above for conductive plugs 540, is formed on the first conductive layer. Note that etch-stop layer 612 facilitates the staggering of conductive plugs 540 shown in FIG. 5.

Note that mask segments 622 of FIG. 6F respectively correspond to the bit lines 204' that terminate within multiplexer 302, as shown in FIG. 5. As such, mask segments 622 terminate within multiplexer 302. When spacers 550 are formed in FIG. 6G, they also form on terminal end walls of mask segments 622 within multiplexer 302. Consequently, spacers 550 loop around the end walls of mask segments 622 and thus loop around the terminal ends of bit lines 204', within multiplexer 302, as shown in FIG. 5, after bit lines 204' are formed in FIG. 6J.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A multiplexer, comprising:
   a first conductive line as a first input of the multiplexer, the first conductive line coupled to a first source/drain region of a first multiplexer gate;
   a second conductive line as a second input of the multiplexer, the second conductive line successively adjacent the first conductive line and coupled to a first source/drain region of a second multiplexer gate;
   a third conductive line as a first output of the multiplexer, the third conductive line coupled to a second source/drain region of the first multiplexer gate;
   a fourth conductive line successively adjacent the third conductive line and coupled to a second source/drain region of the second multiplexer gate; and
   a first conductive member underlying and coupled to the third and fourth conductive lines.

2. The multiplexer of claim 1, wherein the first and second conductive lines are bit lines of a memory array of a semiconductor memory device.

3. multiplexer of claim 1, wherein a spacer loops around an end of the fourth conductive line.

4. multiplexer of claim 3, wherein the spacer overlies the fourth conductive line.

5. The multiplexer of claim 1, further comprising:
   a fifth conductive line as a third input of the multiplexer, the fifth conductive line successively adjacent the second conductive line and coupled to a first source/drain region of a third multiplexer gate;
   a sixth conductive line as a fourth input of the multiplexer, the sixth conductive line successively adjacent the fifth conductive line and coupled to a first source/drain region of a fourth multiplexer gate;
   a seventh conductive line as a second output of the multiplexer, the seventh conductive line coupled to a second source/drain region of the third multiplexer gate;
   an eighth conductive line successively adjacent the seventh conductive line and coupled to a second source/drain region of the fourth multiplexer gate; and
   a second conductive member underlying and coupled to the seventh and eighth conductive lines;
   wherein a distal end of the fourth conductive line is located a first distance from a distal end of the multiplexer;
   wherein a distal end of the eighth conductive line is located a second distance from the distal end of the multiplexer; and
   wherein the first distance is different from the second distance.

6. The multiplexer of claim 5, wherein the first conductive member is located adjacent the distal end of the fourth conductive line and the second conductive member is located adjacent the distal end of the eighth conductive line.

7. The multiplexer of claim 5, wherein the first and second conductive members are located at different distances from an end of the multiplexer.

8. multiplexer of claim 5, wherein first and second spacers respectively loop around ends of the fourth and eighth conductive lines.

9. The multiplexer of claim 8, wherein the first and second spacers respectively overlie the fourth and eighth conductive lines.

10. The multiplexer of claim 5, wherein seventh conductive line is successively adjacent the fourth conductive line and the seventh and eighth conductive lines are in contact with an etch stop layer that overlies the first conductive members and that is located at the same distance from an end of the multiplexer as the first conductive member.

11. A memory device, comprising:
    a plurality of conductive plugs formed on semiconductor substrate;
    a pair of successively adjacent first and second bit lines overlying and in contact with each of the the conductive plugs; and
    first and second multiplexer gates respectively coupled to the first and second bit lines of each pair of successively adjacent first and second bit lines.

12. The memory device of claim 11 further comprises a pair of successively adjacent third and fourth bit lines between successive pairs of successively adjacent first and second bit lines, the third and fourth bit lines overlying and in contact with an etch-stop layer that overlies the conductive plugs.

13. The memory device of claim 11, wherein the first bit line of each pair of successively adjacent first and second bit lines is coupled to a sensing device.

14. The memory device of claim 13, wherein a spacer loops around an end of each of the second bit lines.

15. The memory device of claim 14, wherein the spacer overlies the conductive plugs.

16. The memory device of claim 15, wherein the spacer further overlies the pairs of successively adjacent first and second bit lines.

17. A memory device, comprising:
    a plurality of conductive plugs formed on a semiconductor substrate;
    a pair of successively adjacent first and second bit lines overlying and in contact with each of the conductive plugs;
    a pair of successively adjacent third and fourth bit lines between successive pairs of successively adjacent first and second bit lines, the third and fourth bit lines overlying and in contact with an etch-stop layer that overlies the conductive plugs;
    first and second multiplexer gates respectively coupled to the first and second bit lines of each pair of successively adjacent first and second bit lines, wherein the first bit line of each pair of successively adjacent first and second bit lines is coupled to a sensing device; and
    third and fourth multiplexer gates respectively coupled to the third and fourth bit lines of the pair of successively adjacent third and fourth bit lines, wherein the third bit line of the pair of successively adjacent third and fourth bit lines is coupled to the sensing device.

18. The memory device of claim 17, wherein a spacer loops around an end of each of the second and fourth bit lines.

19. The memory device of claim 18, wherein the spacer overlies the first, second, third, and fourth bit lines.

20. The memory device of claim 17, wherein the conductive plugs are first conductive plugs, wherein the first conductive plugs and the etch-stop layer are located at a first distance from an end of the multiplexer, and further comprising a second conductive plug formed on the substrate at a second distance from the end of the multiplexer that is different than the first distance, wherein the pair of successively adjacent third and fourth bit lines overlies and is contact with the second conductive plug.

21. A memory device, comprising:
    a first insulation layer formed on a semiconductor substrate;

a plurality of conductive plugs passing through the first insulation layer so as to contact the semiconductor substrate;
  a second insulation layer formed overlying the first insulation layer and the conductive plugs;
  an etch-stop layer formed on portions of the second insulation layer;
  a third insulation layer formed overlying the second insulation layer and the etch-stop layer;
  pairs of successively adjacent first and second bit lines passing through the second and third insulation layers so as respectively contact the conductive plugs;
  a pair of successively adjacent third and fourth bit lines passing through the third insulation layer between successive pairs of successively adjacent first and second bit lines so as to contact the etch-stop layer;
  first and second multiplexer gates respectively coupled to the first and second bit lines of each pair of successively adjacent first and second bit lines, wherein the first bit line of each pair of successively adjacent first and second bit lines is coupled to a sensing device; and
  third and fourth multiplexer gates respectively coupled to the third and fourth bit lines of the pair of successively adjacent third and fourth bit lines, wherein the third bit line of the pair of successively adjacent third and fourth bit lines is coupled to the sensing device.

22. The memory device of claim 21 further comprises a plurality of dielectric spacers formed on the third insulation layer so that a dielectric spacer loops around an end of each of the second and fourth bit lines.

23. A memory device, comprising:
  a plurality of conductive plugs formed on a semiconductor substrate;
  a pair of successively adjacent first and second bit lines overlying and in contact with each of the conductive plugs;
  first source/drain regions respectively of first and second multiplexer gates respectively coupled to the first and second bit lines of each pair of successively adjacent first and second bit lines, wherein the first bit line of each pair of successively adjacent first and second bit lines is coupled to a sensing device; and
  second source/drain regions respectively of the first and second multiplexer gates respectively coupled to third bit lines so that the first and second multiplexer gates respectively selectively couple a third bit line to the sensing device.

24. The memory device of claim 23, wherein a spacer loops around an end of each of the second bit lines.

25. The memory device of claim 24, wherein the spacer overlies the conductive plugs.

26. The memory device of claim 25, wherein the spacer further overlies the pairs of successively adjacent first and second bit lines.

* * * * *

UNITED STATES PATENT AND TRADEMARK OFFICE
CERTIFICATE OF CORRECTION

| | | |
|---|---|---|
| PATENT NO. | : 7,968,951 B2 | Page 1 of 1 |
| APPLICATION NO. | : 12/560103 | |
| DATED | : June 28, 2011 | |
| INVENTOR(S) | : Seiichi Aritome | |

It is certified that error appears in the above-identified patent and that said Letters Patent is hereby corrected as shown below:

In column 9, line 24, in Claim 3, before "multiplexer" insert -- The --.

In column 9, line 26, in Claim 4, before "multiplexer" insert -- The --.

In column 9, line 59, in Claim 8, before "multiplexer" insert -- The --.

In column 10, line 5, in Claim 11, after "formed on" insert -- a --.

In column 10, line 8, in Claim 11, after "of the" delete "the".

In column 11, line 12, in Claim 21, delete "as" and insert -- as to --, therefor.

Signed and Sealed this
Sixteenth Day of August, 2011

David J. Kappos
*Director of the United States Patent and Trademark Office*